United States Patent
Park et al.

(10) Patent No.: US 10,310,548 B2
(45) Date of Patent: Jun. 4, 2019

(54) EXPECTED LIFETIME MANAGEMENT

(71) Applicant: Microsoft Technology Licensing, LLC, Redmond, WA (US)

(72) Inventors: Hee jun Park, Sammamish, WA (US); Robert Allen Shearer, Woodinville, WA (US); Victorya Vishnyakov, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 164 days.

(21) Appl. No.: 15/345,228

(22) Filed: Nov. 7, 2016

(65) Prior Publication Data

US 2018/0129243 A1 May 10, 2018

(51) Int. Cl.
| | | |
|---|---|---|
| *G06F 1/08* | (2006.01) | |
| *G06F 11/30* | (2006.01) | |
| *G06F 9/445* | (2018.01) | |
| *G06F 11/00* | (2006.01) | |
| *G01R 31/28* | (2006.01) | |

(52) U.S. Cl.
CPC ............ *G06F 1/08* (2013.01); *G06F 9/44521* (2013.01); *G06F 11/3058* (2013.01); *G01R 31/287* (2013.01); *G01R 31/2856* (2013.01); *G06F 11/008* (2013.01)

(58) Field of Classification Search
CPC ...... G06F 1/08; G06F 9/44521; G06F 11/008; G01R 31/2856; G01R 31/287
See application file for complete search history.

(56) References Cited

U.S. PATENT DOCUMENTS

| | | | |
|---|---|---|---|
| 7,005,871 B1 * | 2/2006 | Davies | G01R 31/2856 324/750.3 |
| 7,444,528 B2 | 10/2008 | Narendra et al. | |
| 7,454,316 B2 | 11/2008 | Bose et al. | |
| 7,506,216 B2 | 3/2009 | Bose et al. | |
| 7,975,175 B2 | 7/2011 | Votta et al. | |

(Continued)

OTHER PUBLICATIONS

Rosing, et al, "Power and Reliability Management of SoCs", In Journal of IEEE Transactions on Very Large Scale Integration (VLSI) Systems vol. 15, No. 4, Apr. 2007, pp. 1-13.

(Continued)

*Primary Examiner* — Terrell S Johnson
(74) *Attorney, Agent, or Firm* — Alleman Hall Creasman & Tuttle LLP

(57) ABSTRACT

A circuit block is operated, for limited times, at a boosted frequency that is above the conventional maximum operating frequency specified to achieve an expected lifetime goal. The aging caused by both regular operation and boosted frequency operation is estimated and tracked block-by-block over the both the lifetime of the part and over shorter windows of time (e.g., daily, weekly, monthly, etc.) The shorter time windows are dynamically assigned aging budgets to ensure the part will still be expected to meet the expected lifetime even though its aging will be at an 'accelerated' rate whenever the block is operated at a boosted frequency. Aging budgets are assigned based on estimates of the amount of aging the block has experienced, and the amount of aging budget that is left for that time window.

19 Claims, 7 Drawing Sheets

(56) References Cited

U.S. PATENT DOCUMENTS

| | | | |
|---|---|---|---|
| 9,310,424 B2 | 4/2016 | Allen-Ware et al. | |
| 2005/0043910 A1* | 2/2005 | Knebel | G06F 11/008 702/106 |
| 2007/0074011 A1 | 3/2007 | Borkar et al. | |
| 2008/0253437 A1 | 10/2008 | Kim et al. | |
| 2013/0047166 A1 | 2/2013 | Penzes et al. | |
| 2013/0246820 A1 | 9/2013 | Branover et al. | |
| 2013/0283289 A1* | 10/2013 | Adinarayan | G06F 9/5094 718/105 |
| 2014/0189439 A1 | 7/2014 | Abellanas et al. | |
| 2014/0189696 A1 | 7/2014 | Abellanas et al. | |
| 2014/0237267 A1 | 8/2014 | Wang et al. | |
| 2016/0026517 A1 | 1/2016 | Bickford et al. | |

OTHER PUBLICATIONS

Coskun, et al., "Analysis and Optimization of MPSoC Reliability", In Journal of Low Power Electronics, vol. 2, No. 1, Apr. 1, 2006, pp. 56-69.

* cited by examiner

EXPECTED LIFETIME MANAGEMENT

BACKGROUND

In modern integrated circuits (ICs), Metal Oxide Semiconductor Field Effect Transistors (MOSFETs) are being constructed at sizes close to their physical limits. The scaling of these devices is to accommodate an ever-increasing demand for faster and more complex Integrated Circuits. This scaling has also resulted in increasingly high electric fields within these MOSFETs. These increased electric fields can contribute to reliability problems for the long term operation of these devices.

SUMMARY

Examples discussed herein relate to an integrated circuit that includes a plurality of electronic components organized as at least two subsystem units. These at least two subsystem units include a first subsystem unit. This first subsystem unit is associated with a first expected lifetime where the first expected lifetime is based on a conventional maximum operating frequency. The integrated circuit also includes a clock manager that is to, based on a first aging budget over a first moving time window, selectively operate the first subsystem unit at a boosted frequency that is higher performance than the conventional maximum operating frequency. The first moving time window corresponds to a selected time interval that is less than the first expected lifetime.

In an example, a method of operating an integrated circuit that includes a plurality of electronic components organized as at least two subsystem units comprises monitoring a plurality of operating conditions of the at least two subsystem units and estimating a respective aging rate over a predetermined time period for each respective subsystem unit. The method also includes accumulating, for each subsystem unit, a plurality of respective aging rates over a plurality of the predetermined time periods to determine a respective age of each respective subsystem unit. The method also includes, based on the age of a respective subsystem unit, determining whether to allow that respective subsystem unit to be operated in a boosted frequency range that is greater than a conventional maximum operating frequency associated with an expected lifetime for the integrated circuit.

In an example, a method of operating a plurality of processor cores on an integrated circuit includes operating, for a first amount of time, a first processor core in a predetermined frequency range associated with an expected lifetime. The first processor core is also operated, for a second amount of time, in a boosted frequency range that has higher performance than the predetermined frequency range. Based on the first amount of time and the second amount of time, the method also determines whether to allow the first processor core to operate in the boosted frequency range.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

In order to describe the manner in which the above-recited and other advantages and features can be obtained, a more particular description is set forth and will be rendered by reference to specific examples thereof which are illustrated in the appended drawings. Understanding that these drawings depict only typical examples and are not therefore to be considered to be limiting of its scope, implementations will be described and explained with additional specificity and detail through the use of the accompanying drawings.

DETAILED DESCRIPTION OF THE EMBODIMENTS

Figure 1:
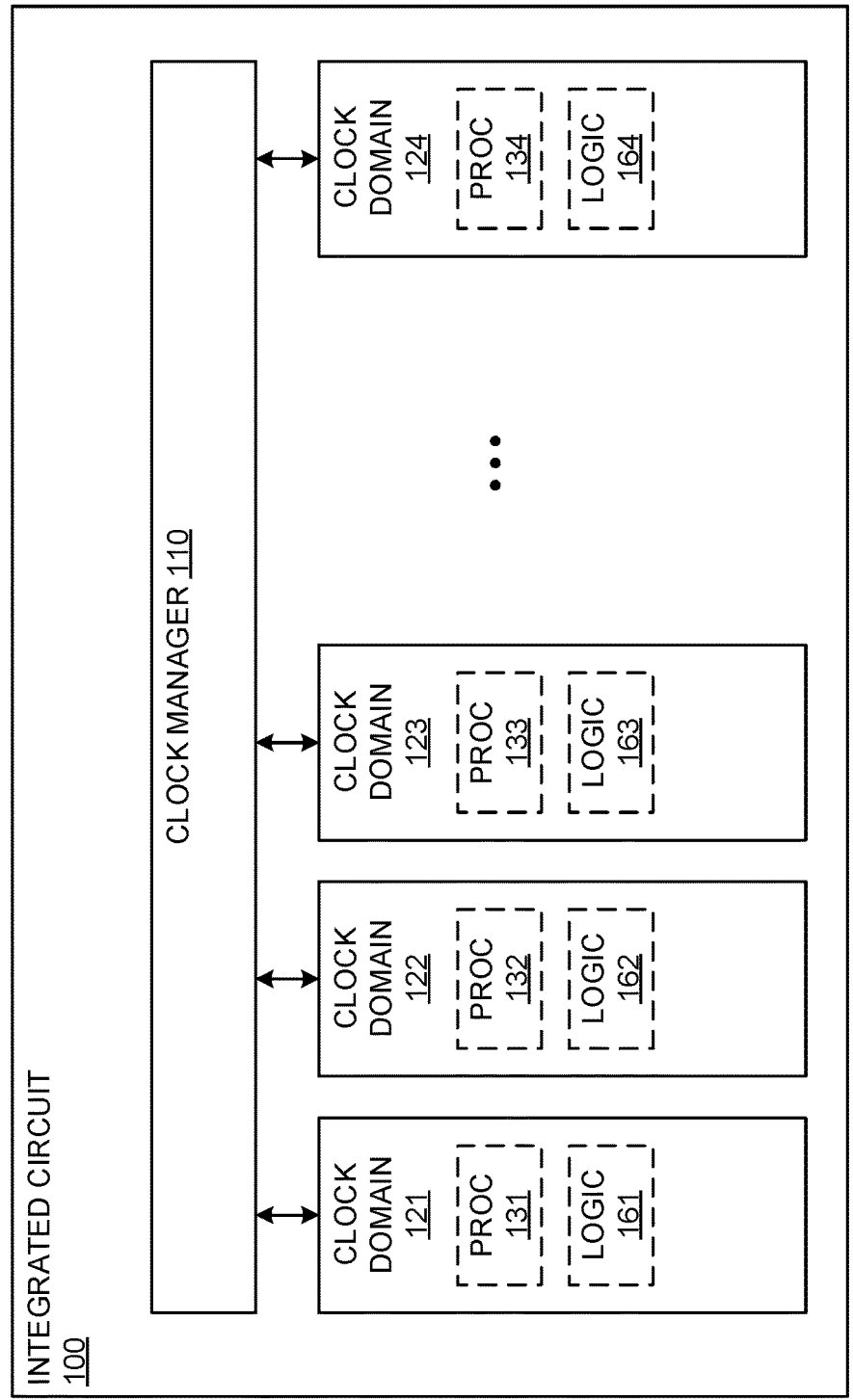
FIG. 1 is a block diagram of an integrated circuit.

Examples are discussed in detail below. While specific implementations are discussed, it should be understood that this is done for illustration purposes only. A person skilled in the relevant art will recognize that other components and configurations may be used without parting from the spirit and scope of the subject matter of this disclosure. The implementations may be a machine-implemented method, a computing device, or an integrated circuit.

The reliability and expected lifetime of an integrated circuit depends on a variety of environmental (e.g., temperature) and operating (e.g., frequency, voltage) conditions that can exacerbate failure mechanisms. For example, there is a correlation between high temperatures and high operating frequency and a shortened expected lifetime. An example of failure mechanisms that can limit the lifetime of an integrated circuit includes metal migration over time. Another example is hot carrier injection (HCI). Hot carrier injection is a phenomenon in solid-state electronic devices where an electron or a "hole" gains sufficient kinetic energy to overcome a potential barrier necessary to break an interface state. The term "hot" refers to the effective temperature used to model carrier density—not to the overall temperature of the device. Since the charge carriers can become trapped in the gate dielectric of a MOS transistor, the switching characteristics of the transistor can be permanently changed.

Another example mechanism that can limit the lifetime of an integrated circuit results from time-dependent gate oxide breakdown (or time dependent dielectric breakdown—TDDB). Time dependent dielectric breakdown is a failure mechanism in MOSFETs that occurs when the gate oxide breaks down as a result of long-time application of relatively low electric field (as opposite to immediate breakdown, which is caused by strong electric field). The breakdown is caused by formation of a conducting path through the gate oxide to substrate due to electron tunneling current. This typically occurs when MOSFETs are operated close to or beyond their specified operating voltages. Yet another example mechanism that can limit the lifetime of an integrated circuit is bias temperature instability (BTI) (a.k.a., negative bias temperature instability—NBTI). These example mechanisms and others typically affect the expected lifetime of an integrated circuit.

Various sub-circuits or blocks (e.g., processors, network interfaces, etc.) of an integrated circuit may be divided into multiple clock domains whose operating frequencies can be raised and lowered independently of the other clock domains. The frequency of operation of a given clock domain is typically lowered to reduce power consumption and heat generation, and raised to improve performance. However, raising the frequency of operation also reduces the expected lifetime of the circuit block. Thus, a significant factor in selecting a conventional maximum operating frequency for a circuit block is a desired expected lifetime.

In an embodiment, a circuit block (a.k.a. clock domain, subsystem, or subsystem unit) is operated, for limited times, at a boosted frequency that is above the conventional maximum operating frequency specified to achieve the expected lifetime. Typically, this would cause the block to fail before the expected lifetime has elapsed. However, in an embodiment, the aging caused by both regular operation and boosted frequency operation is estimated and tracked block-by-block over the both the lifetime of the part (e.g., 5 years) and over shorter windows of time (e.g., daily, weekly, monthly, etc.) The shorter time windows are dynamically assigned aging budgets to ensure the part will still be expected to meet the expected lifetime even though its aging will be at an 'accelerated' rate whenever the block is operated at a boosted frequency.

Aging budgets are assigned based on estimates of the amount of aging the block has experienced, and the amount of an aging budget for that time window that is left. Based on these aging budgets, the block is selectively operated at the boosted frequencies until the amount of aging (either lifetime aging or the aging over the current time window) exceed the corresponding aging budget. In this manner, the accelerated aging of a block caused by being operated at a boosted frequency can be limited in such a way as to ensure that boosted frequency operation is possible for the entire expected (or desired) lifetime of the block or the integrated circuit.

FIG. 1 is a block diagram of an integrated circuit. Integrated circuit 100 is a type of devices, such as is commonly referred to as a "chip". For example, integrated circuit 100 may be or include a microprocessor, a multi-core processor, a system-on-a-chip (SoC), a memory controller, a memory, a northbridge chip, an application specific integrated circuit (ASIC) device, and/or a graphics processor unit (GPU). Integrated circuit 100 may be a device that includes many circuit/logic blocks such as ones selected from graphics cores, processor cores, MPEG encoder/decoders, networking (e.g., Ethernet), and wireless (e.g., Wi-Fi), etc.

As used herein, the term "processor" includes digital logic that executes operational instructions to perform a sequence of tasks. The instructions can be stored in firmware or software, and can represent anywhere from a very limited to a very general instruction set. A processor can be one of several "cores" (a.k.a., 'core processors') that are co-located on a common die or integrated circuit (IC) with other processors. In a multiple processor ("multi-processor") system, individual processors can be the same as or different than other processors, with potentially different performance characteristics (e.g., operating speed, heat dissipation, cache sizes, pin assignments, functional capabilities, and so forth). A set of "asymmetric" or "heterogeneous" processors refers to a set of two or more processors, where at least two processors in the set have different performance capabilities (or benchmark data). A set of "symmetric" or "homogeneous" processors refers to a set of two or more processors, where all of the processors in the set have the same performance capabilities (or benchmark data). As used in the claims below, and in the other parts of this disclosure, the terms "processor", "processor core", and "core processor", or simply "core" will generally be used interchangeably.

In FIG. 1, integrated circuit 100 includes clock manager 110, clock domain 121, clock domain 122, clock domain 123, and clock domain 124. Clock domain 121 may include processor 131 and/or logic circuitry 161. Clock domain 122 may include processor 132 and/or logic circuitry 162. Clock domain 123 may include processor 133 and/or logic circuitry 163. Clock domain 124 may include processor 134 and/or logic circuitry 164. Integrated circuit 100 may include additional clock domains that are not shown in FIG. 1.

Clock manager 110 may be or include logic circuitry to implement a finite state machine to perform the functions described herein. Clock manager 110 may be or include operating system (O/S) software, firmware, or other software running on one or more processors 131-134 and/or stored, either in wholly or in part (e.g., cached), in integrated circuit 100. Clock manager 110 may include software, field-programmable gate array (FPGA) hardware, memory, and/or at least one microprocessor core to implement the functions of clock manager 110 using one or more finite state machines. Clock manager 110 may be specified by a software description of its functionality. This software description may be translated or compiled into the logic circuitry, software, and/or hardware descriptions that implement the functionality of clock manager 110. Software descriptions that describe clock manager 110 may be or include: firmware, behavioral, register transfer, logic component, transistor, and layout geometry-level descriptions.

Clock manager 110 may be configured to manage the frequency of operation of some or all of the functional blocks included in integrated circuit 100. Clock manager 110 may be configured to manage the operating frequencies of multiple clock domains 121-124. Clock manager 110 may include blocks for managing multiple clock operating at multiple frequencies that are provided to various clock domains 121-124. Clock manager 110 may receive signals that indicate the operational state (e.g., busy, idle, etc.) of one or more functional blocks within clock domains 121-124. Based on these signals, clock manager 110 may select the operating frequency(s) of respective clock domains 121-124.

The maximum (conventional) operating frequencies selected for the clock domains 121-124 of integrated circuit 100 are based on many factors. One of these factors includes a reliability requirement or age targets—such as Failure in Time (FIT), Mean Time to Failure (MTTF), etc. These age targets are typically based on assumptions regarding calendar time, operating time, operating frequency, operating voltage, operating current, circuit temperature, etc. For example, in order to expect all of the clock domains 121-124 to function correctly for 5 years of continuous operation at room temperature, a maximum operating frequency of 1 GHz may be specified. However, if the expected lifetime target is only 3 years, a maximum operating frequency of 1.2 GHz may be specified.

Clock manager 110 may manage the operating frequencies of clock domains 121-124 such that one or more of clock domains 121-124 is operated above the conventional maximum operating frequency for that clock domain and the expected lifetime target for integrated circuit 100. The operation of a clock domain 121-124 above the specified operating frequency is also known as 'overclocking' or 'boosted frequency' mode.

Clock manager 110 determines whether to boost the operating frequency of a respective clock domain 121-124 based on the actual usage pattern and/or workload type of the clock domain. For example, if integrated circuit 100 is used for less duration and/or lighter workloads than the assumptions used when setting the conventional maximum operating frequencies for clock domains 121-124, clock manager 100 will allow one or more of clock domains 121-124 to be operated at a boosted frequency (i.e., overclocked).

Clock manager 110 determines whether to allow the boosted frequency operation of a respective clock domain 121-124 based on an aging budget and an estimate of the amount of aging taking place over a moving time window. The estimate of the amount of aging of a respective clock domain 121-124 taking place, both cumulative and over the moving time window, is based on the operating conditions (e.g., operating frequency, voltage, current, temperature, etc.) of that clock domain. The moving time window (e.g., each day, each week, each month, etc.) is selected to be shorter than the expected lifetime. The moving time window is used by clock manager 110 to help ensure that boosted frequency operation is still possible at or near the expected end of life of integrated circuit 100.

For example, if the expected lifetime target for integrated circuit 100 is 100 days, then clock manager 110 may allocate an aging budget of 1% of the overall aging of clock domain 121 to each of those 100 days. In this manner, on the 99$^{th}$ day of operation, clock manager 100 could allow boosted frequency operation of clock domain 121 until it was determined that the 1% budget for the 99$^{th}$ day had been consumed. If clock manager 110 had allowed aging to occur that was greater than 1% on any of the preceding 99 days (e.g., 25% on day 1), then it would be possible that the overall aging budget (i.e., expected lifetime) to be exhausted much earlier than the targeted 100 days (e.g., the lifetime aging budget could be exhausted by day 76—where 25% was exhausted on day 1 and then 1% was exhausted each day for the following 75 days.)

Figure 2:
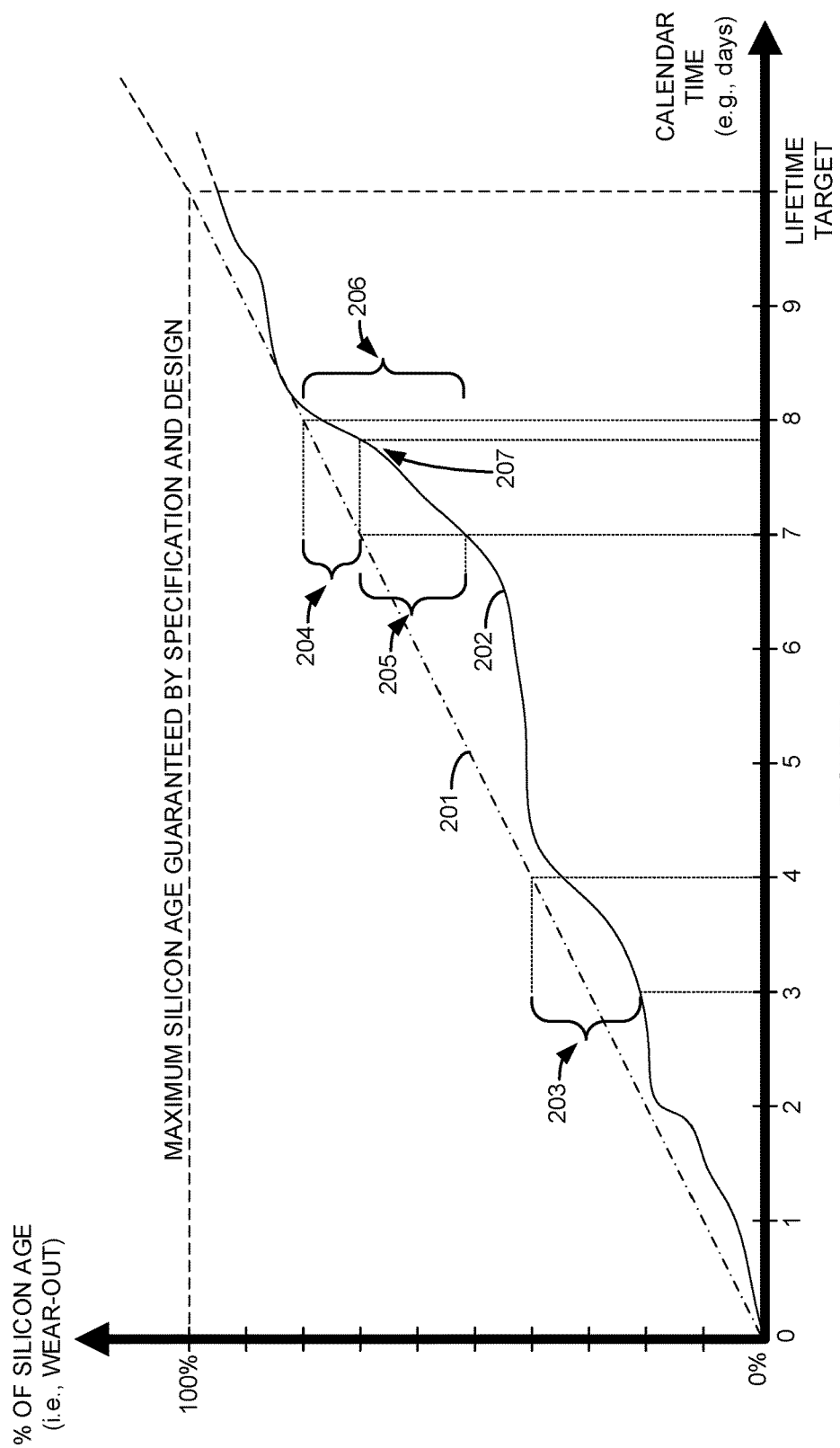
FIG. 2 illustrates a moving time window aging budget.

FIG. 2 illustrates a moving time window aging budget. In FIG. 2, the percentage of the silicon age (i.e., wear-out amount) is shown on the Y-axis ranging from 0% to 100%. On the Y-axis, 0% represents a 'brand new' silicon and 100% represents the maximum silicon age guaranteed by specification and design. The silicon may still operate normally after reaching 100%. However, it should be understood that the silicon has reached the reliability limit guaranteed by the device's specification when 100% is reached. The elapsed operating time (e.g., calendar time) is shown on the X-axis. The X-axis is shown further dividing the lifetime target into ten (10) time windows. These time windows range, for example, from 0 to 10, where 10 is the lifetime target (e.g., 10 years, 10 months, 10 days, etc.) For the purposes of this discussion, the time window from 0 to 1 will be referred to as the 0$^{th}$ time period, from 1 to 2 will be referred to as the 1$^{st}$ time period, etc.

Dashed line 201 illustrates a linear interpolation of the lifetime target vs. percentage. In other words, dashed line 201 illustrates a constant aging rate of 10% of the overall lifetime percentage per time window period. Thus, line 201 can be viewed as an ideal uniform (i.e., per day) allocation of aging vs time that will result in integrated circuit 100 functioning until the lifetime target date.

In FIG. 2, line 202 illustrates an example estimated age vs. time curve. In other words, line 202 illustrates an example of the aging estimate made by clock manager 110 for a clock domain 121-124 over the target lifetime of integrated circuit 100. Bracket 206 illustrates an example aging budget. In FIG. 2, bracket 203 illustrates an aging budget for the 3$^{rd}$ time period (i.e., from time 3 to time 4). In other words, since the estimated age shown by line 202 at time 3 is less than line 201, the aging budget for the time period running from time 3 to time 4 can be selected as the amount of aging between line 202 at time 3 and the total allocation of aging (as shown by line 201) that is to be allowed before time 4. In an embodiment, as long as the estimated age shown by line 202 remains below line 201 during the 3$^{rd}$ time period, clock manager 100 will allow boosted frequency operation.

Brackets 204-206 illustrate other example aging budgets. In FIG. 2, bracket 206 illustrates an example aging budget for the 7$^{th}$ time period (i.e., from time 7 to time 8) calculated similarly to aging budget 203. In other words, since the estimated age shown by line 202 at time 7 is less than line 201, the aging budget for the 7$^{th}$ time period can be selected as at least the amount of aging between line 202 at time 7 and the total allocation of aging (as shown by line 201) that is to be allowed before time 8 (as shown by bracket 206.)

In another example, the aging budget illustrated by bracket 206 can be divided into two parts: a first part where boosted frequency mode is allowed (bracket 205), and a second part where boosted frequency mode is not allowed (bracket 204). In this example, boosted mode is allowed until the estimated amount of aging reaches the total allocation of aging at the start of the 7$^{th}$ time period. This amount of aging is illustrated by bracket 205. After boosted frequency mode is not allowed, which occurs at point 207, only non-boosted mode operation is allowed until another time window (i.e., the 8$^{th}$ time period) begins. The amount of aging that can occur without exceeding the total allocation at the start of the 8$^{th}$ time period is illustrated by bracket 204.

Figure 3:
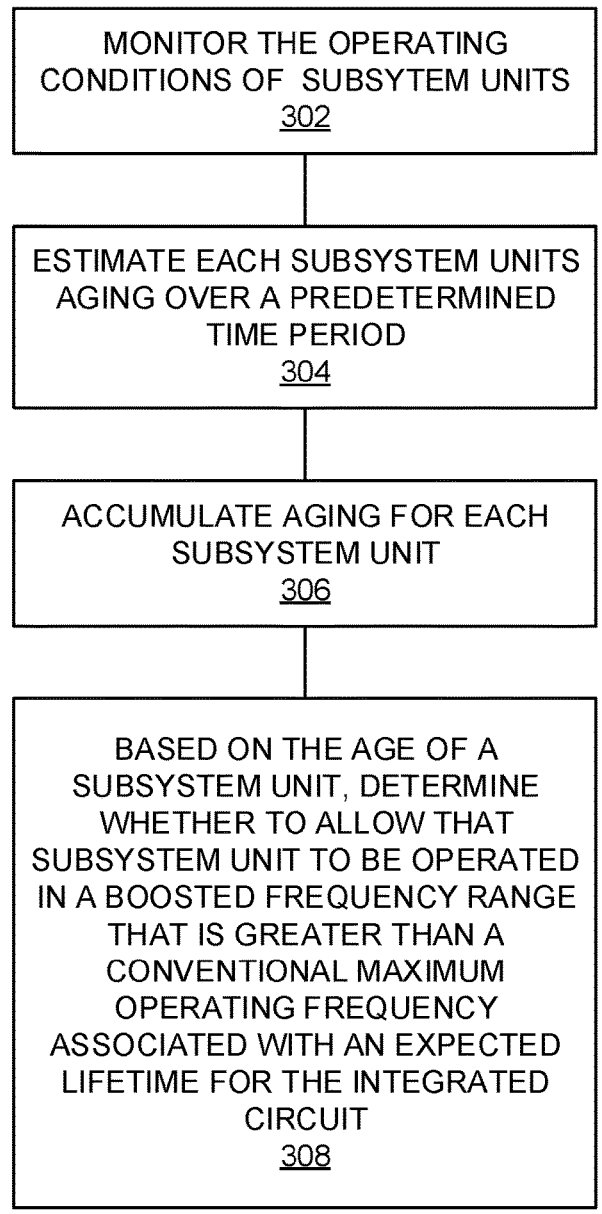
FIG. 3 is a flowchart illustrating a method of operating an integrated circuit.

FIG. 3 is a flowchart illustrating a method of operating an integrated circuit. The steps illustrated in FIG. 3 may be performed, for example, by one or more elements of integrated circuit 100. The operating conditions of subsystem units are monitored (302). For example, clock manager 110 may receive indicators of the operating conditions of clock domains 121-124. These operating conditions may include operating frequency, operating time, voltage, current, temperature, etc.

Each subsystems unit's aging is estimated over predetermined time period (304). For example, using one or more aging models, an estimate of the amount of aging each clock domain 121-124 experiences over a time window (e.g., a day) as a result of the operating conditions over that time window may be estimated by clock manager 110. In one example, the amount of aging over the time period may be estimated using a mathematical model. In another example, the amount of aging over the time period may be estimated using measurements on a hardware circuit that is part of a corresponding clock domain 121-124. Examples of circuits that can be used to estimate aging include a ring oscillator or other circuit loop logic that changes in frequency or delay as the circuit ages.

The aging for each subsystem unit is accumulated (306). For example, after each time period, the amount of aging for that time period of a particular clock domain 121-124 may be summed with the amount of aging that clock domain has experienced from the previous time periods. This total amount of aging (i.e., the 'age' of the subsystem) may be stored in nonvolatile memory. In this manner, an indicator of the total amount of aging that has occurred so far can be maintained.

Based on the age of a subsystem unit, it is determined whether to allow that subsystem unit to be operated in a boosted frequency range that is greater than a conventional maximum operating frequency associated with an expected lifetime for the integrated circuit (308). For example, based on the accumulated age of a subsystem unit (e.g., line 202 of FIG. 2) at the beginning of a time window, clock manager 110 determines whether to allow that subsystem unit to be operated in boosted frequency mode.

Figure 4:
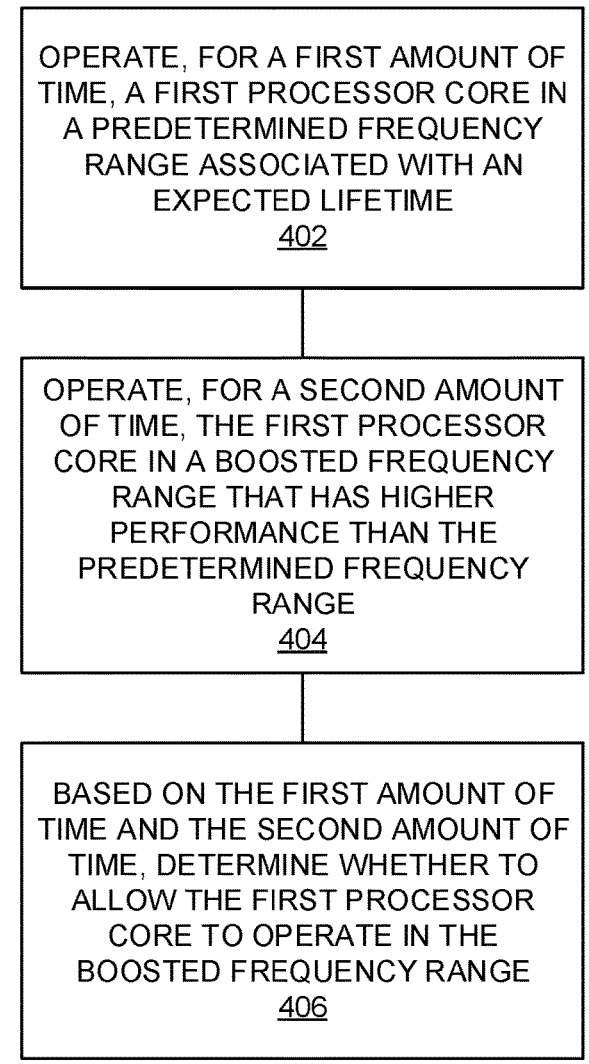
FIG. 4 is a flowchart illustrating a method of selectively operating processor cores in a boosted frequency range.

FIG. 4 is a flowchart illustrating a method of selectively operating processor cores in a boosted frequency range. The steps illustrated in FIG. 4 may be performed, for example, by one or more elements of integrated circuit 100. For a first amount of time, a first processor core is operated in a predetermined frequency range that is associated with an expected lifetime (402). For example, during a part of a time window (e.g., the $3^{rd}$ time period illustrated in FIG. 2), a clock domain 121 having a processor core 131 may be operated at or below the conventional maximum operating frequency associated with the desired lifetime of integrated circuit 100.

For a second amount of time, the first processor core is operated in a boosted frequency range that has higher performance that the predetermined frequency range (404). For example, during a part of the time window (e.g., the $3^{rd}$ time period illustrated in FIG. 2), a clock domain 121 which has processor core 131 may be operated above the conventional maximum operating frequency associated with the desired lifetime of integrated circuit 100—thereby allowing processor 131 to provide higher performance.

Based on the first amount of time and the second amount of time, it is determined whether to allow the first processor core to operate in the boosted frequency range (406). For example, during the time window (e.g., the $3^{rd}$ time period illustrated in FIG. 2), clock manager 110 may determine whether to continue to allow, or whether to start preventing clock domain 121 which has processor core 131 to be operated above the conventional maximum operating frequency. Clock manager 110 may determine whether to continue to allow or prevent processor core 131 from being operated above the conventional maximum operating frequency based on an aging calculation that is based on the respective amounts of time clock domain 121 has been operated in the boosted and 'normal operation' frequency ranges.

Figure 5:
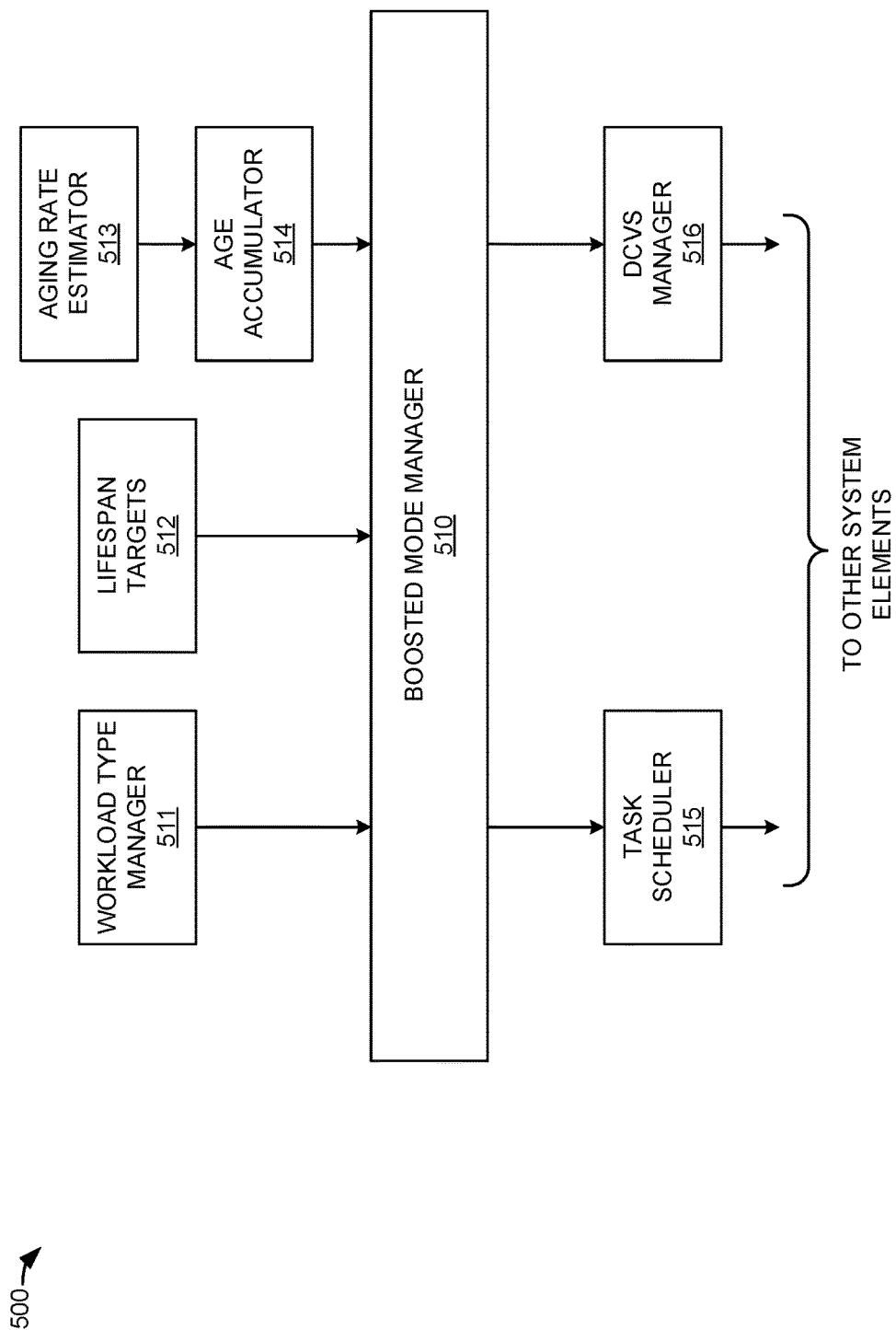
FIG. 5 is an illustration of an aging budget management system.

FIG. 5 is an illustration of an aging budget management system. Management system 500 may be implemented using elements of integrated circuit 100. For example, clock manager 110, clock domains 121-124, processors 131-134, and/or logic 161-164 may be, be part of, be used to implement, or be used to execute software or firmware that implements, the elements and/or functions of management system 500

In FIG. 5, management system 500 includes boosted mode manager 510, workload type manager 511, lifespan targets 512, aging rate estimator 513, age accumulator 514, task scheduler 515, and dynamic clock and voltage scaling (DCVS) manager 516. Workload type manager 511 is operatively coupled to boosted mode manager 510. Workload type manager 511 may be implemented, for example, by an operating system or by other software running on one or more of processors 131-134. Lifespan targets 512 are operatively coupled to boosted mode manager 510. Lifespan targets 512 may be stored by, for example, an on-chip nonvolatile memory or other nonvolatile storage (e.g., disk drive) accessible by boosted mode manager 510.

Aging rate estimator 513 is operatively couple to age accumulator 514. Aging rate estimator 513 may be implemented, for example, by an operating system, by device firmware, or by other software running on one or more of processors 131-134. Age accumulator 514 is operatively coupled to boosted mode manager 510. Age accumulator 514 may be implemented, for example, in hardware (e.g., ring oscillator, device age detecting circuit, etc.), by an operating system, by device firmware, or by other software running on one or more of processors 131-134.

Boosted mode manager 510 is operatively coupled to task scheduler 515. Boosted mode manager 510 is operatively coupled to DCVS manager 516. Task scheduler 515 and DCVS manager 516 are operatively coupled to other system elements (e.g., an operating system, a clock manager, clock domains, processors, etc.) Boosted mode manager 510, task scheduler 515, and DCVS manager 516 may be implemented by, for example, an operating system running on one or more of processors 131-134.

Workload type manager 511 determines and reports to boosted mode manager 510 whether a workload (e.g., application, software task, software process, service, thread etc.) is classified as a continuous workload or is a short-term workload. For example, workload type manager 511 may monitor the elapsed time a workload is running (and running on a boosted frequency clock domain 121-124, in particular) in order to classify the workload. If the workload ends (e.g., completes and/or is idled) before a threshold amount of time (e.g., 0.5 seconds), the workload is classified as short-term. If the workload does not complete within the threshold amount of time, the workload is classified as continuous. In an embodiment, boosted mode manager does not enable boosted frequency mode for clock domains 121-124 that are running workloads that have been classified as continuous.

Lifespan targets 512 store indicators (e.g., in registers and/or nonvolatile memory) to indicate the lifetime targets for each clock domain 121-124. The indicators are provided to boosted mode manager 510 for use in determining whether (and when) to allow a clock domain 121-124 to operate in boosted frequency mode.

Aging rate estimator 513 estimates the aging rate of each clock domain 121-124 over each predetermined time interval. The aging rate estimate for a clock domain 121-124 is based on one or more of the operating frequency, voltage, current and temperature of the clock domain 121-124. Aging rate estimator 513 also provides these aging rates per time interval to age accumulator 514 in order to accumulate the aging rate onto age registers that indicate the age of the clock domain 121-124 since production. The accumulated age of each clock domain (and optionally the aging rate during the current time window) are provided to boosted mode manager 510.

The aging rate can be estimated by using circuits running inside the clock domain 121-124. For example, a ring oscillator or similar circuit logic (e.g., delay line) that is continuously clocked under the same conditions (e.g., frequency, voltage) as the rest of the clock domain 121-124 can be used to estimate the aging of a clock domain 121-124. By monitoring the speed change of the ring oscillator clock (or the delay of a delay line), the aging of a clock domain 121-124 can be estimated. This is because older (i.e., aged) circuits tend to become slower. Therefore, the free-running (or maximum clocked) frequency of the ring oscillator (or delay) becomes lower as the clock domain 121-124 ages towards failure.

In several embodiments, each element of management system 500 can be implemented in either hardware (including low level firmware), or software (including high level kernel or operating system.) Implementing management system 500 in hardware and low level firmware is has the advantages of reducing response time, workload, and security risk. The mathematical formulas that age rate estimator 513 uses can be implemented either in hardware logic or firmware. Implementation in firmware has the advantage of providing more flexibility to upgrade the formulas. The predetermined lifespan targets 512 can be stored (fused) in ROM, a stored in a register, and/or be part of firmware code. Boosted mode manager 510 can be implemented in firmware and hardware for fast response, and to reduce the workload and security risk. It should also be understood that since the functions of management system 500 involve aspects critical to silicon reliability, implementing management system 500 in hardware and firmware also reduces the risk of any unintended modification of parameters by malicious software.

The aging rate can also be estimated based on one or more functions of operating frequency, voltage, current, and/or temperature. Several aging models are given in Table 1.

TABLE 1

Time to failure ~ $J^{-n} * \exp(E_a/(kT))$
Time to failure ~ $(V)^{-n} * \exp(E_a/(kT)) * (A_{ox})^{\wedge}(-1/\beta)$
Time to failure ~ $\exp(-\gamma^*V) * \exp(E_a/(kT))$
Time to failure ~ $(\%I_{dsat})^{\wedge}1/n * \exp(\beta/V) * \exp(E_a/(kT))$
Time to failure ~ $(\%I_{dsat})^{\wedge}1/n * \exp(-\gamma^*V) * \exp(E_a/(kT))$ Where:
T: absolute junction temperature (in Kelvins)
V: gate voltage (in volts)
k: Boltzmann's constant: 8.617E−5 eV/K Boosted mode manager 510 uses the accumulated age of a clock domain 121-124 and/or the aging rate (or incremental aging since the start of the time window) of a clock domain 121-124 to alter the way task scheduler 515 allocates workloads to clock domains 121-124 (and/or processors 131-134.) For example, based on the accumulated age of clock domain 121 and/or the aging rate clock domain 121, boosted mode manager 510 may indicate to task scheduler that heavier (or more) workloads be allocated to run on clock domain 121 relative to the other clock domains 122-124. Likewise, based on the accumulated age of clock domain 121 and/or the aging rate clock domain 121, boosted mode manager 510 may indicate to task scheduler that lighter (or fewer) workloads be allocated to run on clock domain 121 relative to the other clock domains 122-124. Also, in an embodiment, based on the accumulated age of clock domain 121 and/or the aging rate clock domain 121, boosted mode manager 510 may indicate to DCVS manager that workloads allocated to run on clock domain 121 are to (or not to, as appropriate) use boosted frequency mode.

Figure 6:
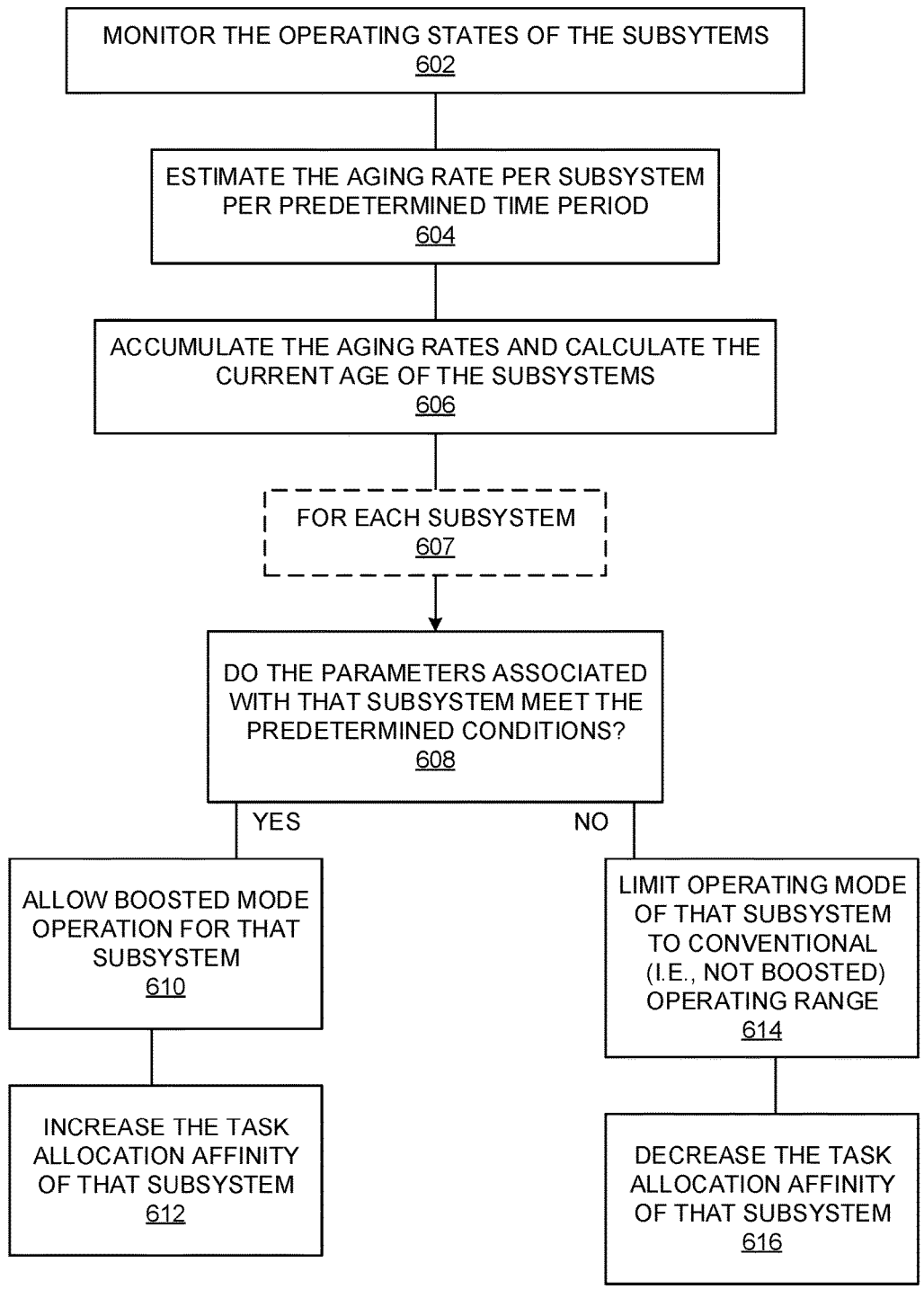
FIG. 6 is a flowchart illustrating a method of selectively allowing/disallowing operation in a boosted frequency range.
Figure 7:
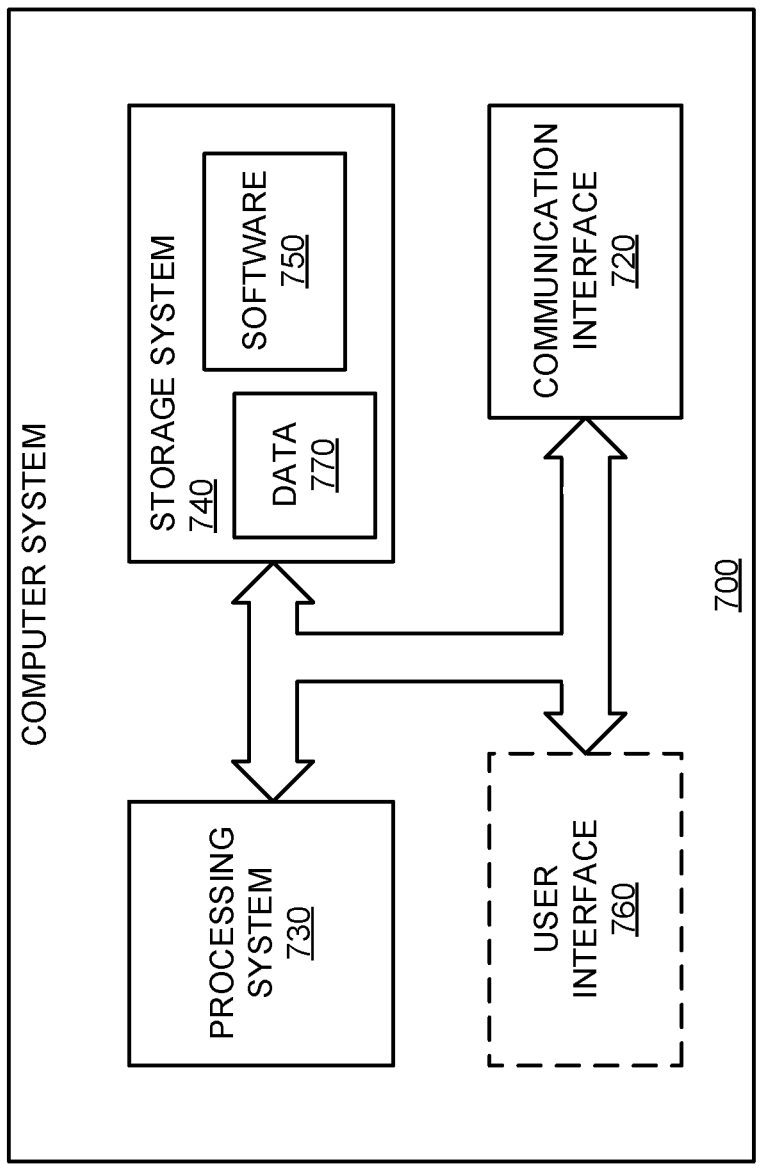
FIG. 7 is a block diagram illustrating a computer system.

FIG. 6 is a flowchart illustrating a method of selectively allowing/disallowing operation in a boosted frequency range. The steps illustrated in FIG. 6 may be performed, for example, by one or more elements of integrated circuit 100 and/or management system 500. The operating states of the subsytems are monitored (602). For example, aging rate estimator 513 may be provided with indicators of one or more of the operating frequency, voltage, current and temperature of the respective clock domains 121-124. Aging rate estimator 513 may be provided with multiple indicators for each of these conditions over a given time interval. For example, aging rate estimator 513 may receive indicators corresponding to the current operating conditions once every second.

The aging rate per subsystem per predetermined time period is estimated (604). For example, aging rate estimator 513 may estimate the aging rate of each clock domain 121-124 over a series of time intervals or windows that make up the desired lifetime of integrated circuit 100. Each estimate for a given time interval may be made based on indicators that are received multiple times over the given time interval (e.g., once a second or once a minute.) The aging rates are accumulated and the current age of the subsystems are calculated (606). For example, age accumulator 514 may sum or otherwise use aging indicators (or aging rate indicators) from aging rate estimator 513 to accumulate values in age registers that indicate the age of each respective clock domain 121-124 since production.

Boxes 608-616 in FIG. 6 are performed with regards to each subsystem (607). If the parameters associated with a subsystem meet the predetermined conditions, flow proceeds to box 610. If the parameters associated with a subsystem do not meet the predetermined conditions, flow proceeds to box 614 (608).

If the parameters associated with a subsystem meet the predetermined conditions, boosted mode operation is allowed for that subsystem (610). For example, if a set of predetermine conditions are met by clock domain 121, clock domain 121 is allowed to be operated in boosted frequency mode. In an embodiment, the set of predetermined conditions include, but are not limited to: (1) the amount of age increase of the subsystem during the current time window being less than a per time window (e.g., daily, weekly, etc.) aging budget; (2) the current subsystem age (as determined from age estimates) being less than the total aging budget; (3) the number of processors 131-136 needed to be running the current set of workloads being less than a selected being less than a threshold (i.e., clock domain 121 is not too hot to be placed in boosted frequency mode.) From box 610, flow proceeds to box 612.

The task allocation affinity for the subsystem that is being allowed to operate in boosted frequency mode is increased (612). For example, once boosted mode manager 510 determines that the set of predetermined conditions are met by clock domain 121, boosted mode manager 510 may indicate to task scheduler 515 that processor 131 should be made more likely to be allocated workloads.

If the parameters associated with a subsystem do not meet the predetermined conditions, boosted mode operation is not allowed for that subsystem (614). For example, if the set of predetermine conditions are not met by clock domain 121, clock domain 121 is not allowed to be operated in boosted frequency mode. From box 614, flow proceeds to box 616.

The task allocation affinity for the subsystem that is not being allowed to operate in boosted frequency mode is decreased (616). For example, once boosted mode manager 510 determines that the set of predetermine conditions are not met by clock domain 121, boosted mode manager 510 may indicate to task scheduler 515 that processor 131 should be made less likely to be allocated workloads relative to other clock domains 122-124.

The methods, systems and devices described herein may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of processing system 100, and/or management system 500, and their components. These software descriptions may be: behavioral, register transfer, logic component, transistor, and layout geometry-level descriptions.

Data formats in which such descriptions may be implemented are stored on a non-transitory computer readable medium include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Physical files may be implemented on non-transitory machine-readable media such as: 4 mm magnetic tape, 8 mm magnetic tape, 3-½-inch floppy media, CDs, DVDs, hard disk drives, solid-state disk drives, solid-state memory, flash drives, and so on.

Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), multi-core processors, graphics processing units (GPUs), etc.

Computer system 700 includes communication interface 720, processing system 730, storage system 740, and user interface 760. Processing system 730 is operatively coupled to storage system 740. Storage system 740 stores software 750 and data 770. Processing system 730 is operatively coupled to communication interface 720 and user interface 760. Processing system 730 may be an example of one or more of integrated circuit 100, clock domains 121-124, processors 131-134, management system 500, and/or their components.

Computer system 700 may comprise a programmed general-purpose computer. Computer system 700 may include a microprocessor. Computer system 700 may comprise programmable or special purpose circuitry. Computer system 700 may be distributed among multiple devices, processors, storage, and/or interfaces that together comprise elements 720-770.

Communication interface 720 may comprise a network interface, modem, port, bus, link, transceiver, or other communication device. Communication interface 720 may be distributed among multiple communication devices. Processing system 730 may comprise a microprocessor, microcontroller, logic circuit, or other processing device. Processing system 730 may be distributed among multiple processing devices. Optional user interface 760 may comprise a keyboard, mouse, voice recognition interface, microphone and speakers, graphical display, touch screen, or other type of user interface device. User interface 760 may be distributed among multiple interface devices. Storage system 740 may comprise a disk, tape, integrated circuit, RAM, ROM, EEPROM, flash memory, network storage, server, or other memory function. Storage system 740 may include computer readable medium. Storage system 740 may be distributed among multiple memory devices.

Processing system 730 retrieves and executes software 750 from storage system 740. Processing system 730 may retrieve and store data 770. Processing system 730 may also retrieve and store data via communication interface 720. Processing system 750 may create or modify software 750 or data 770 to achieve a tangible result. Processing system may control communication interface 720 or user interface 760 to achieve a tangible result. Processing system 730 may retrieve and execute remotely stored software via communication interface 720.

Software 750 and remotely stored software may comprise an operating system, utilities, drivers, networking software, and other software typically executed by a computer system. Software 750 may comprise an application program, applet, firmware, or other form of machine-readable processing instructions typically executed by a computer system. When executed by processing system 730, software 750 or remotely stored software may direct computer system 700 to operate as described herein.

Implementations discussed herein include, but are not limited to, the following examples:

Example 1: An integrated circuit, comprising: a plurality of electronic components organized as at least two subsystem units, the at least two subsystem units including a first subsystem unit, the first subsystem unit associated with a first expected lifetime that is based at least in part on a conventional maximum operating frequency; and, a clock manager to, based at least in part on a first aging budget over a first moving time window, selectively operate the first subsystem unit at a boosted frequency that is higher performance than the conventional maximum operating frequency, the first moving time window corresponding to a selected time interval that is less than the first expected lifetime.

Example 2: The integrated circuit of example 1, wherein the first aging budget is based at least in part on a predetermined amount of aging to be allowed over the selected time interval.

Example 3: The integrated circuit of example 2, wherein the first subsystem unit may be operated at the boosted frequency based at least in part on a first aging estimate being less than the predetermined amount of aging over the selected time interval.

Example 4: The integrated circuit of example 2, wherein the first subsystem unit may be operated at the boosted frequency based at least in part on a first accumulated age estimate.

Example 5: The integrated circuit of example 4, wherein the first subsystem unit may be operated at the boosted frequency based at least in part on the first accumulated age estimate being less than a maximum allowed aging versus elapsed time curve that is based at least in part on a linear interpolation of the first expected lifetime.

Example 6: The integrated circuit of example 5, wherein the clock manager is to, based at least in part on a second aging budget over a second moving time window, selectively operate a second subsystem unit at the boosted frequency, the second moving time window corresponding to the selected time interval.

Example 7: The integrated circuit of example 6, wherein the first subsystem unit is selected to be operated at the boosted frequency based at least in part on the first aging estimate being less of the first aging budget over the first moving time window than the second aging estimate is of the second aging budget over the second moving time window.

Example 8: A method of operating an integrated circuit that includes a plurality of electronic components organized as at least two subsystem units, comprising: monitoring a plurality of operating conditions of the at least two subsystem units; estimating a respective aging rate over a predetermined time period for each respective subsystem unit; accumulating, for each subsystem unit, a plurality of respective aging rates over a plurality of the predetermined time periods to determine a respective age of each respective subsystem unit; and, based at least in part on the age of a respective subsystem unit, determining whether to allow that respective subsystem unit to be operated in a boosted frequency range that is greater than a conventional maximum operating frequency associated with an expected lifetime for the integrated circuit.

Example 9: The method of example 8, further comprising: based at least in part on the age of a respective subsystem unit, increasing a task allocation affinity corresponding to the respective subsystem unit in order to increase a probability the respective subsystem unit will be allocated a heavier workload.

Example 10: The method of example 8, further comprising: based at least in part on the age of a respective subsystem unit, decreasing a task allocation affinity corresponding to the respective subsystem unit in order to decrease a probability the respective subsystem unit will be allocated a heavier workload.

Example 11: The method of example 8, wherein the determination of whether to allow the respective subsystem unit to be operated in the boosted frequency range if further based at least in part on a respective aging rate of a predetermined time period.

Example 12: The method of example 11, wherein the respective aging rate is associated with the most recent predetermined time period.

Example 13: The method of example 8, wherein the determination of whether to allow the respective subsystem unit to be operated the boosted frequency range is further based at least in part on a temperature of the respective subsystem unit.

Example 14: The method of example 8, further comprising: base at least in part on determining that a task running on a subsystem unit that is operating in the boosted frequency range has exceeded a threshold amount of time to complete, stopping that subsystem unit from being operated in the boosted frequency range.

Example 15: The method of example 14, wherein after the task stops running on the subsystem unit, the subsystem unit is re-allowed to be operated in the boosted frequency range.

Example 16: A method of operating a plurality of processor cores on an integrated circuit, comprising: operating, for a first amount of time, a first processor core in a predetermined frequency range associated with an expected lifetime; operating, for a second amount of time, the first processor core in a boosted frequency range that has higher performance than the predetermined frequency range; and, based at least in part on the first amount of time and the second amount of time, determining whether to allow the first processor core to operate in the boosted frequency range.

Example 17: The method of example 16, wherein the first amount of time and the second amount of time are used to calculate an estimated aging rate of the first processor core over a predetermined time interval window, and wherein the determination of whether to allow the first processor core to operate in the boosted frequency range is based at least in part on the estimated aging rate of the first processor core that is associated with a recent predetermined time interval window.

Example 18: The method of example 17, wherein the first amount of time and the second amount of time are used to estimate an accumulated age of the first processor core, and wherein the determination of whether to allow the first processor core to operate in the boosted frequency range is based at least in part on the accumulated age of the first processor core meeting a threshold criteria.

Example 19: The method of example 18, wherein the threshold criteria is based at least in part on a linear interpolation of the expected lifetime.

Example 20: The method of example 19, further comprising: based at least in part on the estimated aging rate of the first processor core over the predetermined time interval window and a second estimated aging rate of a second processor core over the predetermined time interval window, adjusting a first task allocation affinity associated with the first processor core relative to a second task allocation affinity associated with the second processor core.

The foregoing descriptions of the disclosed embodiments have been presented for purposes of illustration and description. They are not intended to be exhaustive or to limit the scope of the claimed subject matter to the precise form(s) disclosed, and other modifications and variations may be possible in light of the above teachings. The embodiments were chosen and described in order to best explain the principles of the disclosed embodiments and their practical application to thereby enable others skilled in the art to best utilize the various embodiments and various modifications as are suited to the particular use contemplated. It is intended that the appended claims be construed to include other alternative embodiments except insofar as limited by the prior art.

What is claimed is:

1. An integrated circuit, comprising:
   a plurality of electronic components organized as at least two subsystem units, the at least two subsystem units including a first subsystem unit, the first subsystem unit associated with a first expected lifetime that is based at least in part on a conventional maximum operating frequency; and
   a clock manager configured to:
      determine, for each of a plurality of time windows, a respective aging estimate of the first subsystem unit;
      accumulate each respective aging estimate to thereby determine a first accumulated age estimate; and
      based on one or more of a first aging budget over a first moving time window and on the first accumulated age estimate, selectively operate the first subsystem unit at a boosted frequency that effects higher performance than the conventional maximum operating frequency, the first moving time window corresponding to a selected time interval that is less than the first expected lifetime.

2. The integrated circuit of claim 1, wherein the first aging budget is based at least in part on a predetermined amount of aging to be allowed over the selected time interval.

3. The integrated circuit of claim 2, wherein the first subsystem unit may be operated at the boosted frequency based at least in part on a first aging estimate being less than the predetermined amount of aging over the selected time interval.

4. The integrated circuit of claim 1, wherein the first subsystem unit may be operated at the boosted frequency based at least in part on the first accumulated age estimate being less than a maximum allowed aging versus elapsed time curve that is based at least in part on a linear interpolation of the first expected lifetime.

5. The integrated circuit of claim 1, wherein the clock manager is configured to, based at least in part on a second aging budget over a second moving time window, selectively operate a second subsystem unit at the boosted frequency, the second moving time window corresponding to the selected time interval.

6. The integrated circuit of claim 5, wherein the first subsystem unit is selected to be operated at the boosted frequency based at least in part on a first aging estimate being less of the first aging budget over the first moving time window than a second aging estimate is of the second aging budget over the second moving time window.

7. A method of operating an integrated circuit that includes a plurality of electronic components organized as at least two subsystem units, comprising:
    monitoring a plurality of operating conditions of the at least two subsystem units; estimating a respective aging rate over a predetermined time period for each respective subsystem unit;
    accumulating, for each subsystem unit, a plurality of respective aging rates over a plurality of the predetermined time periods to determine a respective age of each respective subsystem unit; and
    based at least in part on the age of a respective subsystem unit, determining whether to allow that respective subsystem unit to be operated in a boosted frequency range that is greater than a conventional maximum operating frequency associated with an expected lifetime for the integrated circuit.

8. The method of claim 7, further comprising:
    based at least in part on the age of a respective subsystem unit, increasing a task allocation affinity corresponding to the respective subsystem unit in order to increase a probability the respective subsystem unit will be allocated a heavier workload.

9. The method of claim 7, further comprising:
    based at least in part on the age of a respective subsystem unit, decreasing a task allocation affinity corresponding to the respective subsystem unit in order to decrease a probability the respective subsystem unit will be allocated a heavier workload.

10. The method of claim 7, wherein the determination of whether to allow the respective subsystem unit to be operated in the boosted frequency range if further based at least in part on a respective aging rate of a predetermined time period.

11. The method of claim 10, wherein the respective aging rate is associated with the most recent predetermined time period.

12. The method of claim 7, wherein the determination of whether to allow the respective subsystem unit to be operated the boosted frequency range is further based at least in part on a temperature of the respective subsystem unit.

13. The method of claim 7, further comprising:
    based at least in part on determining that a task running on a subsystem unit that is operating in the boosted frequency range has exceeded a threshold amount of time to complete, stopping that subsystem unit from being operated in the boosted frequency range.

14. The method of claim 13, wherein after the task stops running on the subsystem unit, the subsystem unit is re-allowed to be operated in the boosted frequency range.

15. A method of operating a plurality of processor cores on an integrated circuit, comprising:
    operating, for a first amount of time, a first processor core in a predetermined frequency range associated with an expected lifetime;
    operating, for a second amount of time, the first processor core in a boosted frequency range that has higher performance than the predetermined frequency range;
    calculating a first aging rate of the first processor core over a first time window based on the first amount of time;
    calculating a second aging rate of the processor core over a second time window based on the second amount of time;
    estimating an accumulated age of the first processor core by accumulating the first aging rate and the second aging rate; and
    based at least in part on the first amount of time and the second amount of time, determining whether to allow the first processor core to operate in the boosted frequency range.

16. The method of claim 15, wherein the determination of whether to allow the first processor core to operate in the boosted frequency range is based at least in part on the first aging rate and the second aging rate.

17. The method of claim 15, wherein the determination of whether to allow the first processor core to operate in the boosted frequency range is based at least in part on the accumulated age of the first processor core meeting a threshold criteria.

18. The method of claim 17, wherein the threshold criteria is based at least in part on a linear interpolation of the expected lifetime.

19. The method of claim 18, further comprising:
    based at least in part on the first aging rate over the first time window and an aging rate of a second processor core over the first time window, adjusting a first task allocation affinity associated with the first processor core relative to a second task allocation affinity associated with the second processor core.

* * * * *